United States Patent
Kim et al.

(10) Patent No.: US 8,354,306 B2
(45) Date of Patent: Jan. 15, 2013

(54) METHOD OF FABRICATING ORGANIC LIGHT EMITTING DIODE DISPLAY

(75) Inventors: Woochan Kim, Paju-si (KR); Byungchul Ahn, Seoul (KR); Changwook Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 672 days.

(21) Appl. No.: 12/591,220

(22) Filed: Nov. 12, 2009

(65) Prior Publication Data
US 2010/0291720 A1    Nov. 18, 2010

(30) Foreign Application Priority Data
May 12, 2009 (KR) .......................... 10-2009-0041245

(51) Int. Cl.
*H01L 21/00* (2006.01)
(52) U.S. Cl. .......... 438/149; 438/82; 438/455; 438/656; 438/761; 438/780
(58) Field of Classification Search .................. 438/82, 438/149, 455, 656, 761, 778, 780, 974, FOR. 157, 438/FOR. 184, FOR. 201, FOR. 287
See application file for complete search history.

(56) References Cited

U.S. PATENT DOCUMENTS

| | | | |
|---|---|---|---|
| 7,388,329 B2 * | 6/2008 | Kim et al. ..................... | 313/512 |
| 2003/0148021 A1 | 8/2003 | Ishizuka | |
| 2003/0230238 A1 | 12/2003 | Papadimitrakopoulos et al. | |
| 2006/0141135 A1 | 6/2006 | Wang et al. | |
| 2006/0226773 A1 * | 10/2006 | Kim et al. ..................... | 313/512 |
| 2008/0131993 A1 * | 6/2008 | Forrest et al. ................... | 438/82 |
| 2008/0176349 A1 * | 7/2008 | Suh et al. ........................ | 438/34 |
| 2008/0224607 A1 | 9/2008 | Matsuo et al. | |
| 2008/0268135 A1 | 10/2008 | Yokoyama et al. | |
| 2009/0038550 A1 | 2/2009 | Higo | |
| 2009/0130385 A1 * | 5/2009 | Lee et al. ...................... | 428/138 |

FOREIGN PATENT DOCUMENTS

| | | |
|---|---|---|
| CN | 1700814 | 11/2005 |
| EP | 883 190 | 12/1998 |

* cited by examiner

*Primary Examiner* — N Drew Richards
*Assistant Examiner* — Joannie A Garcia
(74) *Attorney, Agent, or Firm* — McKenna Long & Aldridge, LLP

(57) ABSTRACT

A method of fabricating an organic light emitting diode display device includes: sequentially forming a thin film transistor (TFT) array, a first electrode, a bank pattern, a spacer, and a first relevant layer on an acceptor substrate; sequentially forming a metal pattern and an organic light emission material layer on a doner substrate; aligning and attaching the acceptor substrate and the doner substrate, and forming the light emission layer by transferring the organic light emission material onto the acceptor substrate by applying power to the metal pattern; and sequentially forming the second relevant layer and the second electrode on the light emission layer-formed acceptor substrate.

10 Claims, 10 Drawing Sheets

$Wd \leq Wp + Wb$

METHOD OF FABRICATING ORGANIC LIGHT EMITTING DIODE DISPLAY

This nonprovisional application claims priority under 35 U.S.C. §119(a) to Patent Application No. 10-2009-0041245 filed in the Republic of Korea on May 12, 2009, the entire contents of which are hereby incorporated by reference for all purposes.

BACKGROUND OF THE INVENTION

1. Field of the Invention

This disclosure relates to a method of fabricating an organic light emitting diode display.

2. Discussion of the Related Art

Recently, various flat panel display devices are being developed to reduce weight and volume, the shortcomings of the existing cathode ray tubes (CRTs). Such flat panel display device includes a liquid crystal display (LCD), a field emission display (FED), a plasma display panel (PDP), an electroluminescence (EL) device, and the like.

The PDP receives much attention as a display device because its fabrication process is simple and it is so light, thin, short, and small as to be most favored to secure a large scale screen, but has shortcomings in that its luminous efficiency and luminance are low and it consumes much power. A thin film transistor (TFT) LCD is one of the most commonly used flat panel display devices, but with a problem in that its viewing angle is narrow and response speed is low. The EL device is divided into an inorganic light emitting diode display device and an organic light emitting diode display device according to a material of a light emission layer. Among them, the organic light emitting diode display device, a self-emission device, has advantages of fast response speed and high luminous efficiency and luminance, and a wide viewing angle.

The organic light emitting diode display device has an organic light emitting diode (OLED) as shown in FIG. 1.

The OLED includes an organic compound layer, and cathode and anode electrode facing each other with the organic compound layer interposed therebetween. The organic compound layer is formed as a multi-layer by stacking an electron injection layer (EIL), an electron transport layer (ETL), an emission layer (EML), a hole transport layer (HTL), and a hole injection layer (HIL). When a driving voltage is applied to the anode and cathode electrodes, holes which have passed through the HTL and electrons which have passed through the ETL are moved to the EML to form exciters to resultantly make the EML emit visible light.

In the related art OLED display device, the EML is formed through a thermal evaporation method as shown in FIG. 2. To perform the thermal evaporation method, a boat 30 that houses EML materials for R, G, and B, and a metal mask 20 for inducing the EML materials transferred from the resistance-heated boat 30 such that they are deposited at a corresponding position are required, the metal mask 20, supported by a mask frame 25, is aligned on a substrate 10 with a thin film transistor (TFT) array 15 formed thereon. In the related art OLED display device, the R, G, and B EMLs are deposited by changing the alignment position of the metal mask 20.

Such related art OLED display device fabrication method has the following problems.

First, in the related art method, the size of the metal mask is determined according to the size of a substrate. As the substrate is increased in size, the size of the metal mask is bound to be increased. As the size of the metal mask increases, the mask is increasingly bent. Thus, in the related art deposition method using the metal mask, it is difficult to precisely pattern a light emission layer, failing to cope with a large area and high definition.

Second, in the related art method, the board holding the light emission materials is separated by a certain distance from a substrate and heated, and then, the light emission materials are deposited on the substrate, which results in lengthening of a process total accumulated time (TACT) in forming a light emission layer. As the substrate is increased in size, the distance (D) between the substrate and the boat is bound to be increased to secure uniformity of the light emission layer deposited on the substrate, leading to an increase in the size of a chamber used for forming the light emission layer.

SUMMARY OF THE INVENTION

An aspect of this document is to provide a method of fabricating an organic light emitting diode display device capable of precisely patterning a light emission layer to support a larger area and high definition.

Another aspect of this document is to provide a method of fabricating an organic light emitting diode display device capable of reducing a process TACT in forming a light emission layer and the size of a chamber for forming the light emission layer.

In an aspect, a method of fabricating an organic light emitting diode display device including a plurality of OLEDs each having a first electrode, a first relevant layer, a light emission layer, a second relevant layer, and a second electrode, the method includes: sequentially forming a thin film transistor (TFT) array, the first electrode, a bank pattern, a spacer, and the first relevant layer on an acceptor substrate; sequentially forming a metal pattern and an organic light emission material layer on a doner substrate; aligning and attaching the acceptor substrate and the doner substrate, and forming the light emission layer by transferring the organic light emission material layer onto the acceptor substrate by applying power to the metal pattern; and sequentially forming the second relevant layer and the second electrode on the light emission layer-formed acceptor substrate, wherein the spacer is formed to be narrower than the bank pattern.

The metal pattern may be made of one or an alloy of two or more of Ag, Au, Al, Cu, Mo, Pt, Ti, W, and Ta, and is patterned according to a pixel position of the acceptor substrate where the light emission layer is to be formed.

The width of the metal pattern may be smaller than or the same as the sum of a pixel width and a bank pattern width.

The forming of the light emission layer may be performed under a vacuum or an inert gas atmosphere.

The power may be applied one or several times with a power density of 0.1 W/cm$^2$~10000 W/cm$^2$ within one second.

The spacer may be formed as one of a line, column, and well type spacers.

The method of fabricating an organic light emitting diode display device may further include: forming an electric insulation layer on the metal pattern before the organic light emission material layer is formed.

The electric insulation layer may include at least one of a silicon oxide film, a silicon nitride film, a silicon oxynitride film, and a spin-on-glass (SOG) material.

The first and second electrodes may be anode and cathode electrodes, respectively, the first relevant layer is a hole relevant layer handling introduction and carrying of holes, and the second relevant layer is an electron relevant layer handling introduction and carrying of electrons.

The first and second electrodes may be cathode and anode electrodes, respectively, the first relevant layer is an electron relevant layer handling introduction and carrying of electrons, and the second relevant layer is a hole relevant layer handling introduction and carrying of holes.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Exemplary embodiments of the present invention will now be described with reference to FIGS. 3 to 11.

Figure 1:
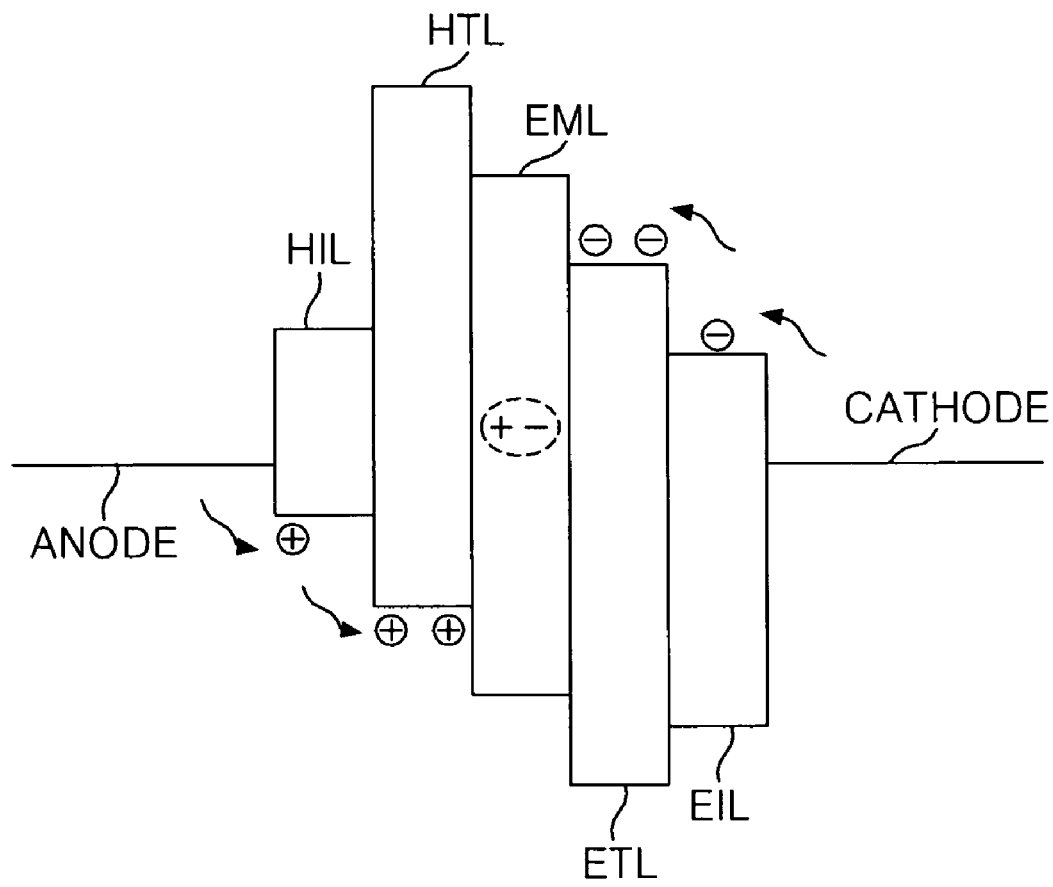
FIG. 1 illustrates the structure of a related art organic light emitting diode.
Figure 2:
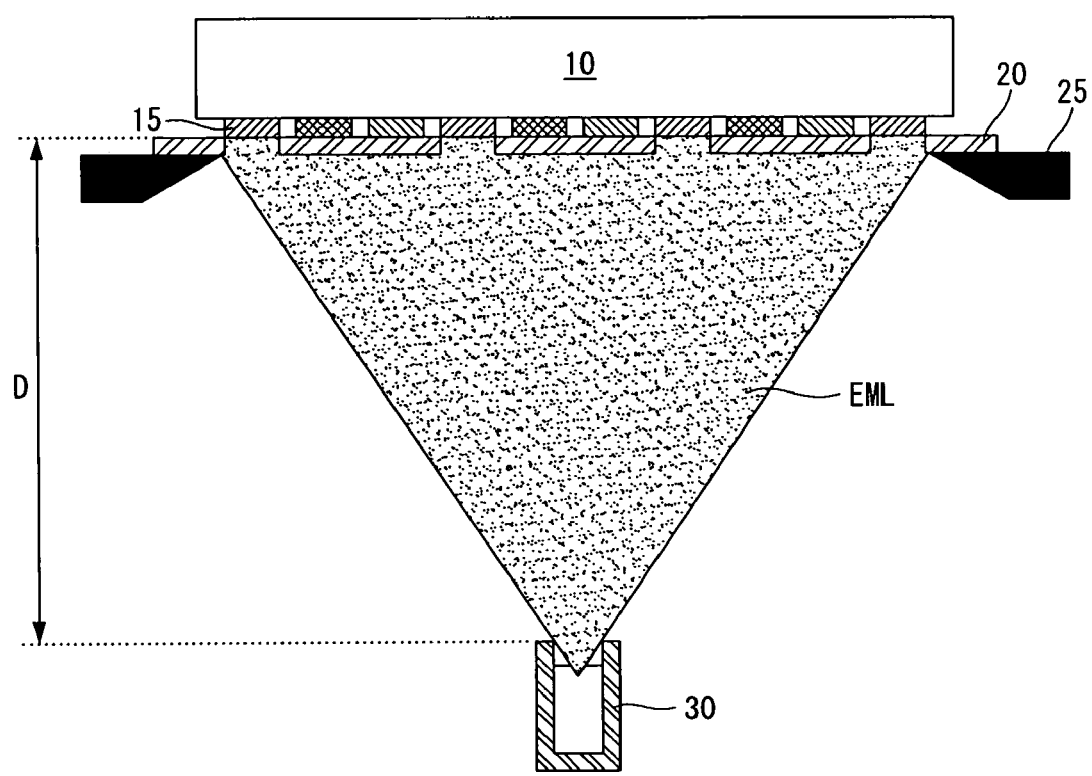
FIG. 2 illustrates formation of a light emission layer through the related art boat method using a metal mask.
Figure 3:
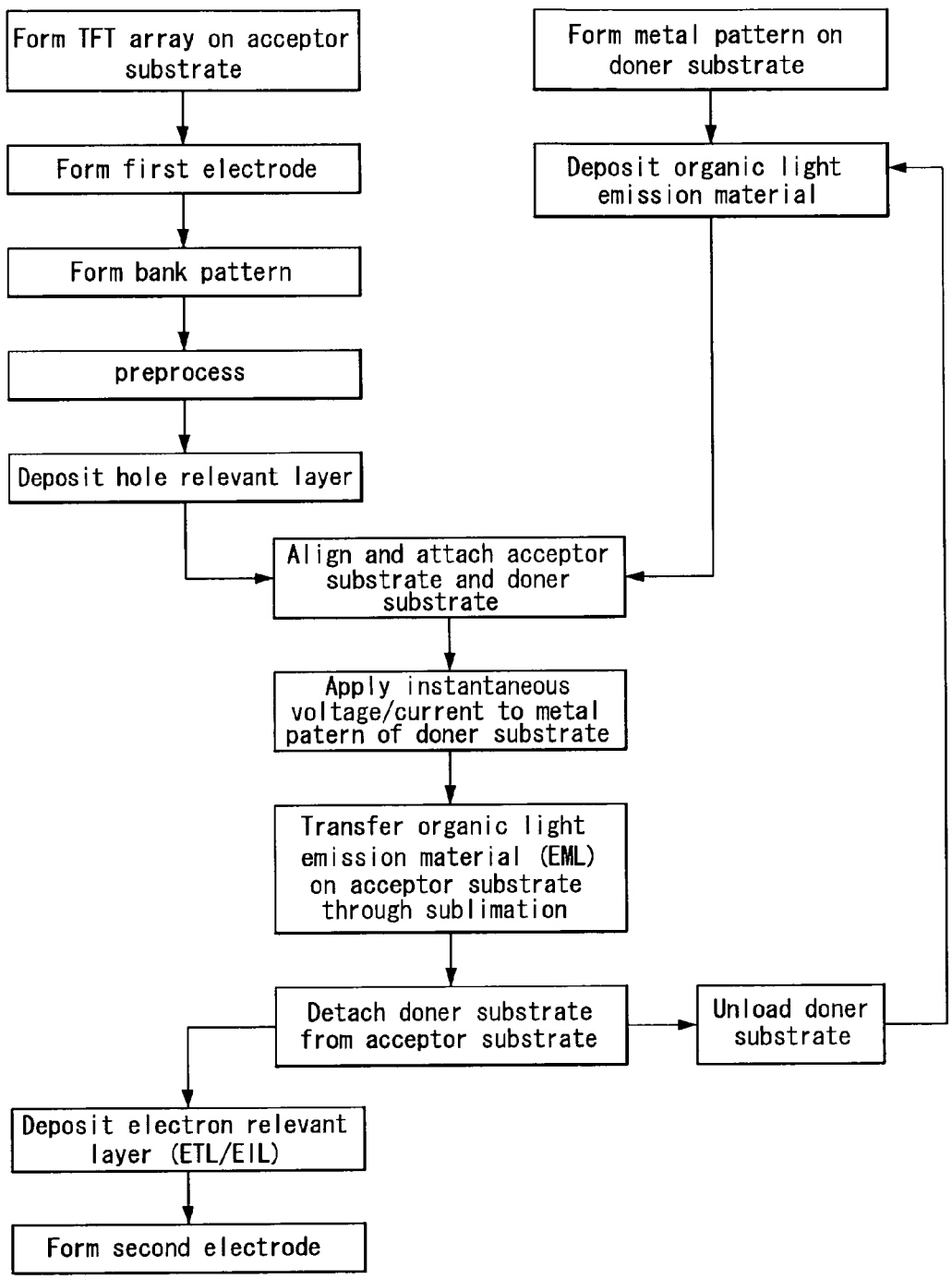
FIG. 3 is a flow chart illustrating the process of a method of fabricating an organic light emitting diode (OLED) display device according to an exemplary embodiment of the present invention.

With reference to FIG. 3, according to a method of fabricating an organic light emitting diode (OLED) display device according to an exemplary embodiment of the present invention, an acceptor substrate with a thin film transistor (TFT) array, a first electrode of OLED, a bank pattern, and a hole relevant layer formed thereon and a doner substrate with a metal pattern and an organic light emission material formed thereon are aligned and attached under an inert gas atmosphere. Subsequently, an instantaneous voltage/current is applied to the metal pattern of the doner substrate to generate Joule heat to sublimate the organic light emission material formed on the doner substrate so as to be transferred to the acceptor substrate. Such attaching and transferring process is performed simultaneously on R, G, and B pixels one time, respectively, while attaching/detaching and unloading the doner substrate. After the light emission layers are formed on all of the R, G, and B pixels, an electron relevant layer and a second electrode of OLED are sequentially deposited on the acceptor substrate with the R, G, and B light emission layers formed thereon.

The process of forming the TFT array, the first electrode of OLED, the band pattern, and the hole relevant layer on the acceptor substrate, and the process of forming the metal pattern and the organic light emission material on the doner substrate will now be described.

Figure 4A:
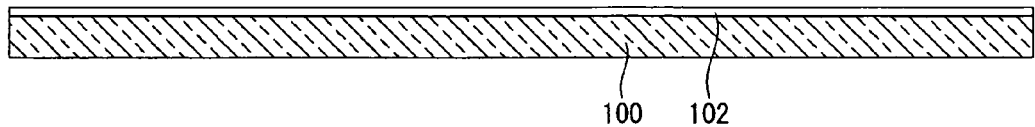
FIGS. 4a to 4d are sequential sectional views showing the process of forming a thin film transistor (TFT) array, and a first electrode, a bank pattern, and a hole relevant layer of an OLED on an acceptor substrate.
Figure 8A:
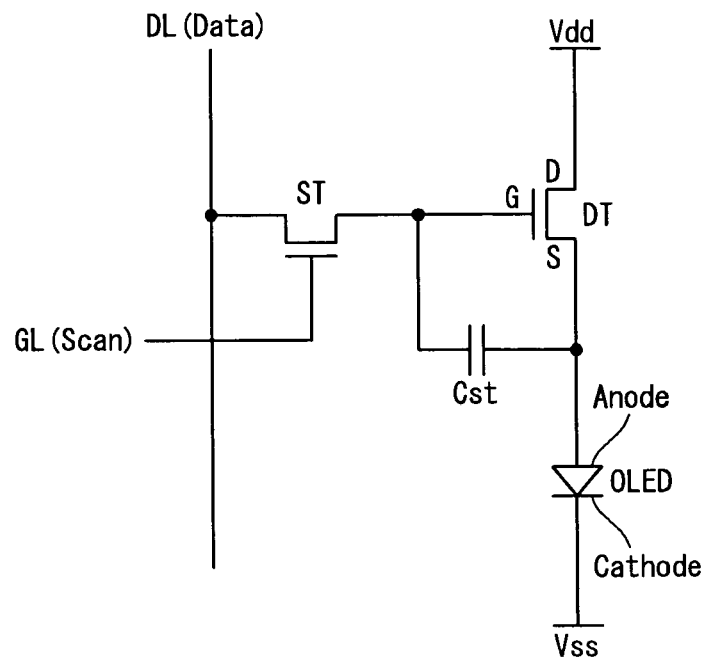
FIGS. 8a to 8c are equivalent circuits of a pixel.
Figure 8B:
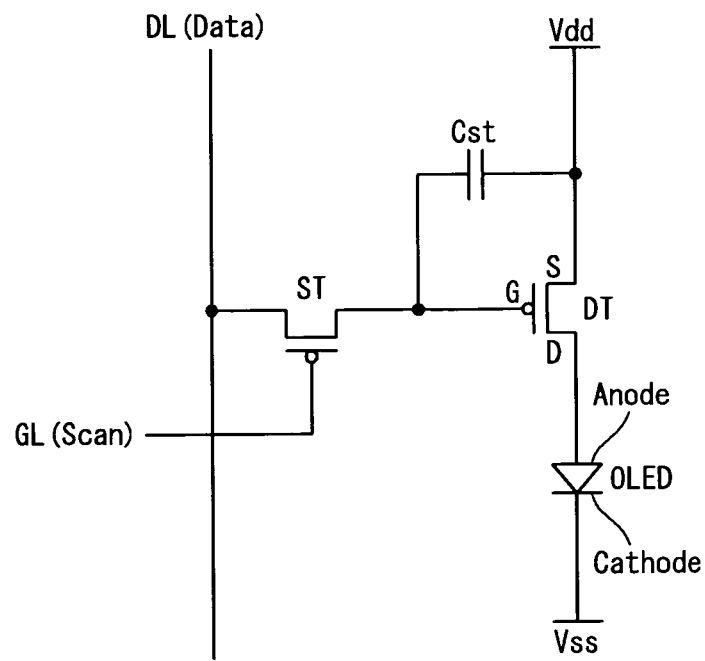
Figure 8C:
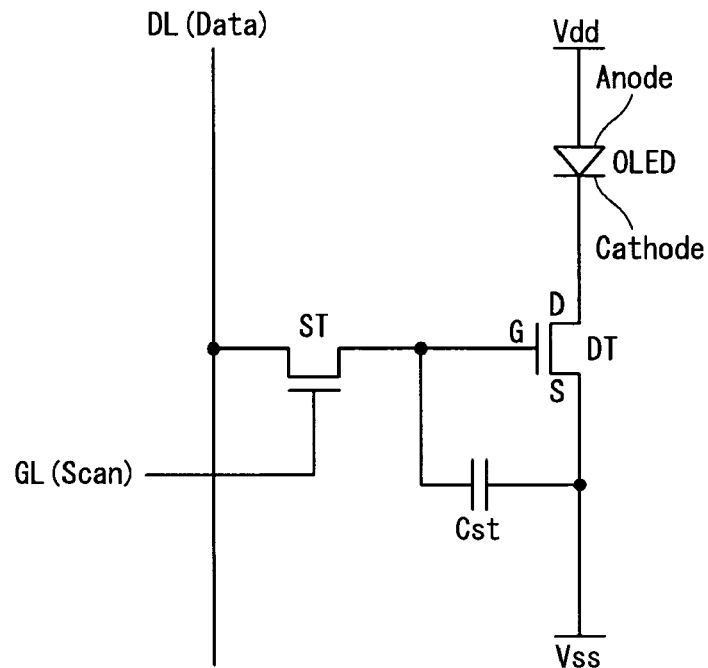

With reference to FIG. 4a, the TFT array 102 including a gate line GL, a data line DL, a switch TFT (ST), a driving TFT (DT), a storage capacitor Cst, a Vdd supply wiring, a Vss supply wiring, and the like, as shown in FIGS. 8a to 8c is formed on the acceptor substrate 100 made of transparent glass or a plastic material. The TFTs (ST and DT) may be implemented as N type MOSFETs as shown in FIG. 8a and 8c, or may be implemented as P type MOSFETs as shown in FIG. 8b. An equivalent circuit of a pixel illustrated in FIGS. 8a to 8c is an example of a general 2T1C structure, and the TFT array structure of the present invention is not limited thereto. The TFT array 102 may include a passivation layer for protecting the TFT array against an external environment, an overcoat layer for preventing generation of a step due to the TFTs (ST and DT), and a buffer layer for shielding out-gasing from the overcoat layer.

Figure 4B:
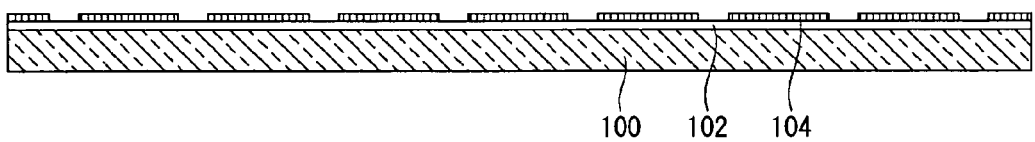

With reference to FIG. 4b, first electrodes 104 of OLED are formed on the acceptor substrate 100 with the TFT 102 formed thereon. The first electrodes 104 come in contact with one electrode of the driving TFT (DT) through the buffer layer, the overcoat layer, the passivation layer, and the like. The first electrodes 104 may be anode electrodes or cathode electrodes having a reflection film according to a connection structure with the driving TFT (DT). In other words, in FIG. 8a, the first electrode 104 is an anode electrode connected with a source electrode (S) of the driving TFT (DT), in FIG. 8b, the first electrode 104 is an anode electrode connected with a drain electrode (D) of the driving TFT (DT), and in FIG. 8c, the first electrode 104 is a cathode electrode connected with a drain electrode (D) of the driving TFT (DT). Hereinafter, it is assumed that the first electrode 104 is an anode electrode having a reflection film. The first electrode 104 is a transparent conductor containing oxide such as indium tin oxide (ITO) or indium zinc oxide (IZO), which is patterned by pixels on the reflection film made of an opaque metal material. The first electrode 104 applies holes, which are supplied by way of the driving TFT (DT), to an organic compound layer.

Figure 4C:
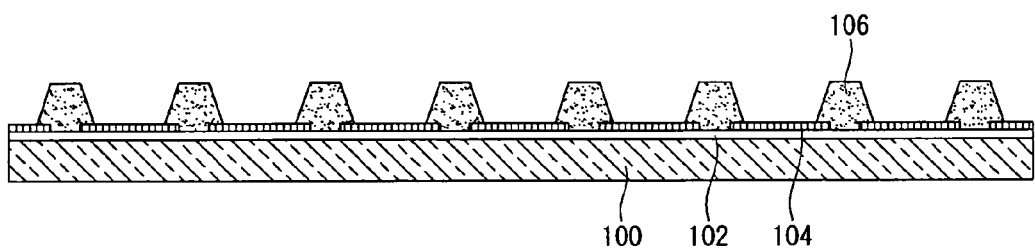

With reference to FIG. 4c, bank patterns 106 are formed on the acceptor substrate 100 with the anode electrode 104 formed thereon. The bank patterns 106 are formed at boundary regions between pixels, partitioning opening regions of respective pixels. After the bank patterns 106 are formed on the acceptor substrate 100, pre-processing is performed using plasma. The pre-processing is performed to remove debris remaining on the acceptor substrate 100 before the organic compound layer of OLED is formed.

Figure 4D:
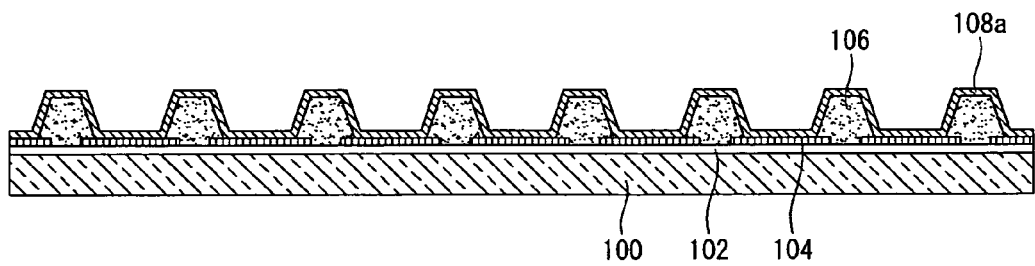

With reference to FIG. 4d, a hole injection layer (HIL) material and a hole transport layer (HTL) material are successively deposited on the entire surface of the acceptor substrate 100 with the bank patterns 106 formed thereon through a thermal evaporation process using an existing boat or the like to form a hole relevant layer 108a.

Figure 5A:
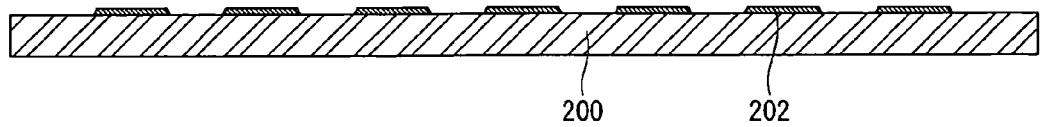
FIGS. 5a and 5b are sequential sectional view showing the process of forming a metal pattern and an organic light emission material on a doner substrate.
Figure 9:
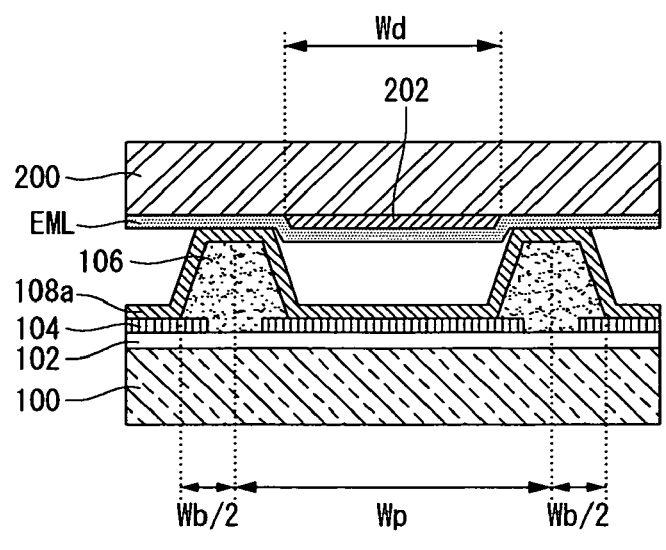
FIG. 9 illustrates the width of a metal pattern compared with a pixel width and a bank pattern width.

With reference to FIG. 5a, metal patterns 202 are formed on the doner substrate 200 made of transparent glass or a plastic material. The size of the doner substrate 200 may be equal to or larger than the size of the acceptor substrate 100. The metal patterns 202 may include at least one or two or more of Ag, Au, Al, Cu, Mo, Pt, Ti, W, and Ta, or an alloy material. The metal patterns 202 may be obtained by depositing the metal or alloy on the entire surface of the substrate by using one of a chemical vapor deposition process, a sputtering process, an e-beam process, and an electrolysis/electroless plating process, and then patterned the deposited metal or alloy through a photolithography process, a wet etching process, or a dry etching process. The metal patterns 202 are formed to correspond to pixel positions of the acceptor substrate 20 to which the organic light emission material is to be transferred. As shown in FIG. 9, the width Wd of the metal pattern 202 may be equal to or smaller than a value obtained by adding the width Wb of the bank pattern 106 partitioning neighboring pixels to a width (Wp) of each R, G, and B pixel of the acceptor substrate 200. The thickness of the metal pattern 202 may be within a maximum 1 μM in consideration of a resistance component that generates Joule heat.

Figure 5B:
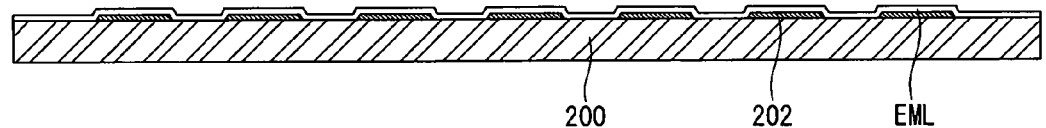

With reference to FIG. 5b, the organic emission layer (EML) material is deposited on the entire surface of the doner substrate 200 with the metal patterns 202 formed thereon through a thermal evaporation process using the existing boat or the like.

In order to prevent the metal patterns 202, which generate Joule heat, from being oxidized or spreading to the organic emission layer (EML) material to be transferred, in the present invention, an electric insulation layer 204 may be formed between the metal patterns 202 and the organic emission layer (EML) material. Here, the electric insulation layer 204 may be selected from among a silicon oxide film, a silicon nitride film, a silicon oxynitride film and deposited on the entire surface of the metal patterns 202 through a CVD process or a sputtering process. In addition, as the electric insulation layer 204, a material such as spin-on-glass (SOG) may be selected to be deposited on the entire surface of the metal patterns 202 through a thermal process after spin-coating is performed thereon.

Next, the process of forming the light emission layer through attachment and transferring will now be described.

Figure 6A:
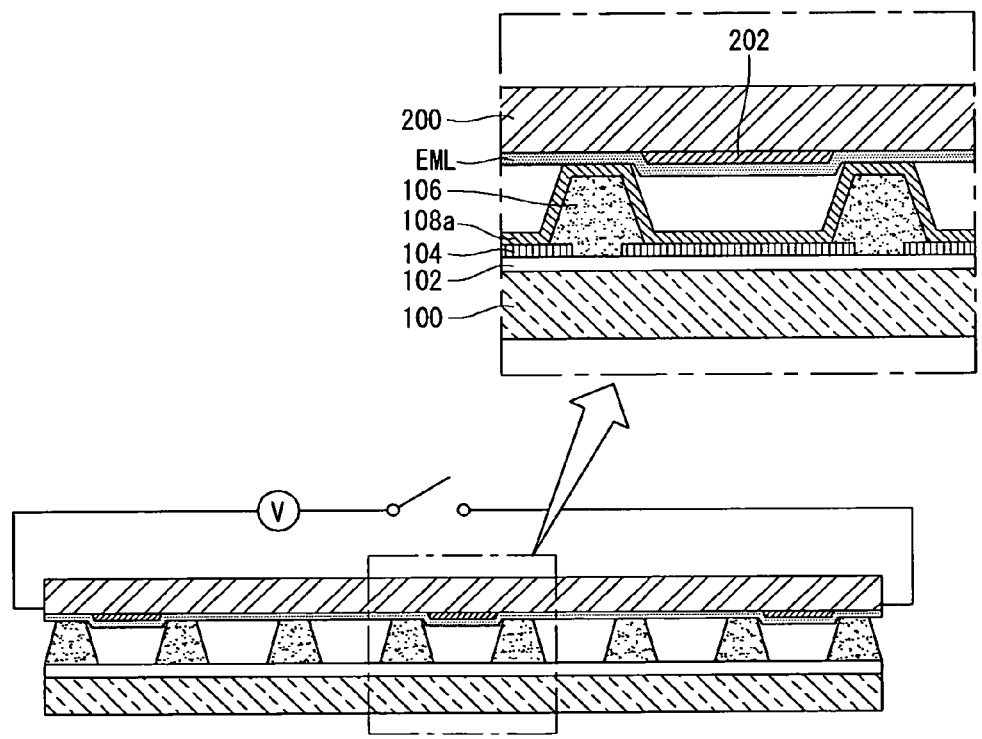
FIGS. 6a and 6b are sequential sectional views showing the process of forming a light emission layer through attachment and transferring.

With reference to FIG. 6a, the acceptor substrate 100 with the hole relevant layer 108a formed thereon and the doner substrate 200 with the organic emission layer (EML) material formed thereon are aligned and attached. The aligning and attaching process is performed under vacuum or inert gas (Ar, N$_2$, etc.) atmosphere to protect the organic emission layer (EML) material against moisture/oxygen. The attachment may be performed through mechanical pressing.

Figure 6B:
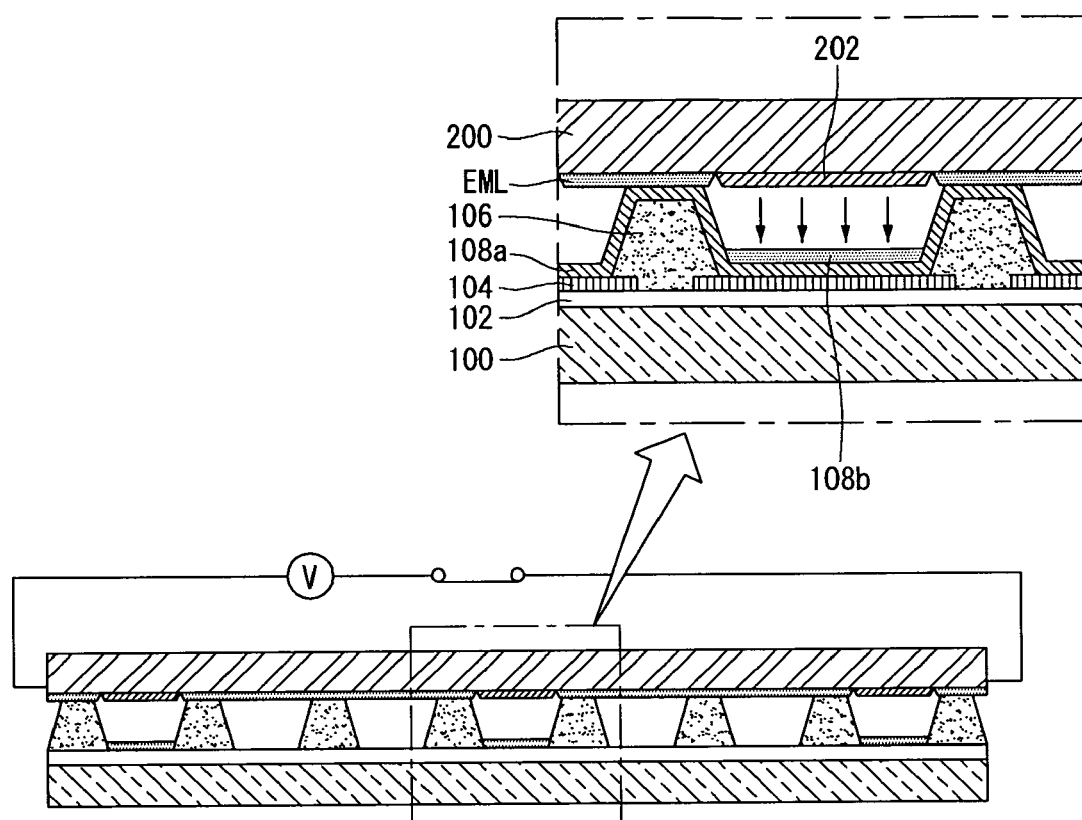

With reference to FIG. 6b, power (V) is applied from the exterior to the metal patterns of the doner substrate 200 for which the aligning and attaching process has been completed. The power (V) application causes the metal patterns 202 to generate Joule heat to sublimate the upper organic emission layer (EML) material. As a result, the organic emission layer (EML) material is transferred to a corresponding region of the acceptor substrate 100 to form a light emission layer 108b. Here, because the acceptor substrate 100 and the doner substrate 200 are substantially tightly attached with the bank patterns 106 interposed therebetween, a color mixing phenomenon that may be otherwise generated as the transfer position of the organic emission layer (EML) material is misaligned or spreads can be prevented in the exemplary embodiment of the present invention. In other words, in the exemplary embodiment of the present invention, the existing boat method using a metal mask is not used in forming the light emission layer 108b, so the light emission layer 108b can be precisely patterned to fit to an increase in size of a substrate, properly coping with the trend of a large substrate and high definition.

If the organic emission layer (EML) material is exposed to high temperature for a long time, the material may be altered or its chemical bonding is broken. Thus, in order to prevent the organic emission layer (EML) material from being thermally altered, a time duration for applying power to the metal patterns 202 is preferably, within the range of 0.1 μs to 1 s, and the density of power applied to the metal patterns 202 is preferably within 0.1 W/cm$^2$ to 10000 W/cm$^2$. Power applied to metal patterns 202 may be AC power or DC power, and may be intermittently applied several times. According to an exemplary embodiment of the present invention, a process time required for forming the light emission layer 108b can be significantly reduced compared with the existing boar method using a metal mask, increasing throughput.

Figure 10:
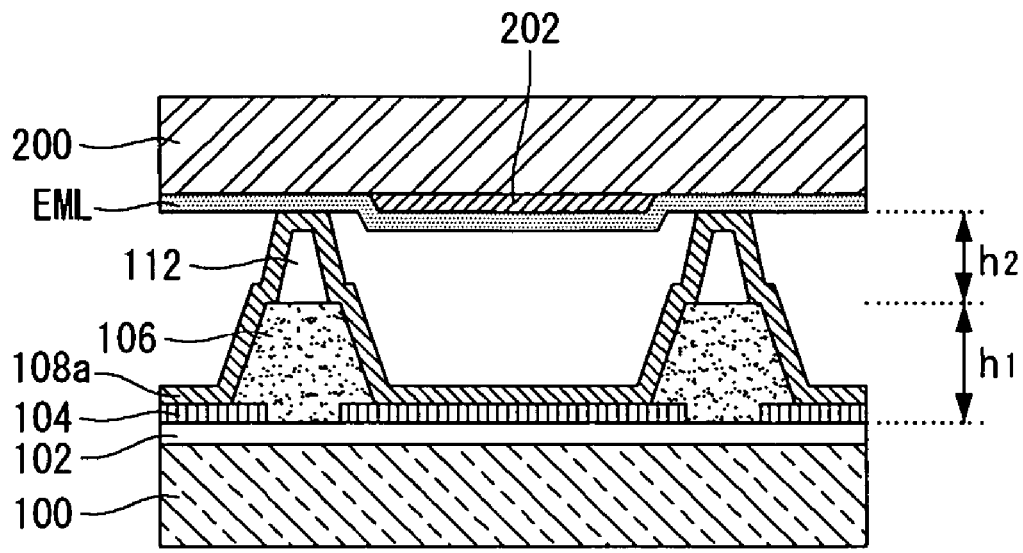
FIG. 10 is a process sectional view showing further inclusion of a spacer.
Figure 11:
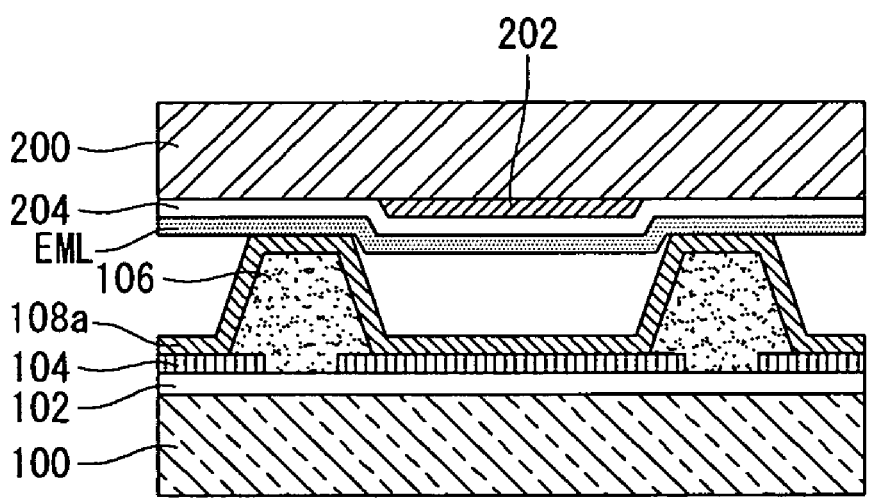
FIG. 11 is a process sectional view showing further inclusion of an electric insulation layer.

In an exemplary embodiment of the present invention, a shown in FIG. 10, spacers 112 may be formed to be narrower than the bank patterns 106 between the bank patterns 106 and the hole relevant layer 108a. The spacer 112 may be formed in a line or column type on the bank pattern 106, or may be formed in a well type. The spacers 112 increase the partitioning height between pixels to prevent the organic emission layer (EML) material from being deposited at a neighboring pixel in a different color, thus effectively preventing generation of a color mixing phenomenon or the like. In addition, the spacers 112 reduce a contact area between the acceptor substrate 100 and the doner substrate 200 informing the light emission layer 108b, to facilitate attaching and detaching of the substrates 100 and 200, resulting in a considerable reduction in the possibility of generation of debris in attaching or detaching the substrates 100 and 200. In case of forming the spacers 112, a deposition distance of the organic emission layer (EML) material by Joule heat is determined by a height h1 of the bank pattern 106 and a height h2 of the spacer 112. In spite of the formation of the spacers, the deposition distance of the organic emission layer (EML) material is remarkably reduced compared with that in the existing boat method, so the size of a chamber for forming the light emission layer 108b can be drastically reduced.

Such attaching and transferring process is simultaneously performed on the R, G, and B pixels one time, respectively, while attaching/detaching and unloading the doner substrate 200. After the light emission layer is transferred to all the R, G, and B pixels, the attaching and transferring process is finished.

The process of forming the electron relevant layer and the second electrode of OLED will now be described.

Figure 7A:
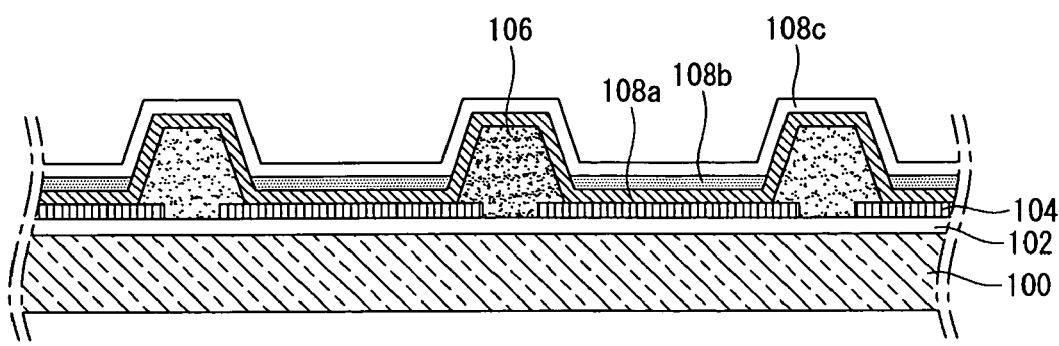
FIGS. 7a and 7b are sequential sectional views showing the process of forming an electron relevant layer and a second electrode of the OLED.

With reference to FIG. 7a, an electron transport layer (ETL) material and an electron injection layer (EIL) material are successively deposited on the entire surface of the acceptor substrate 100 with the light emission layer 108b formed thereon, through a thermal evaporation process using the existing boat or the like to form an electron relevant layer 108c. The hole relevant layer 108a, the light emission layer 108b, and the electron relevant layer 108c constitute an organic compound layer 108 of OLED.

Figure 7B:
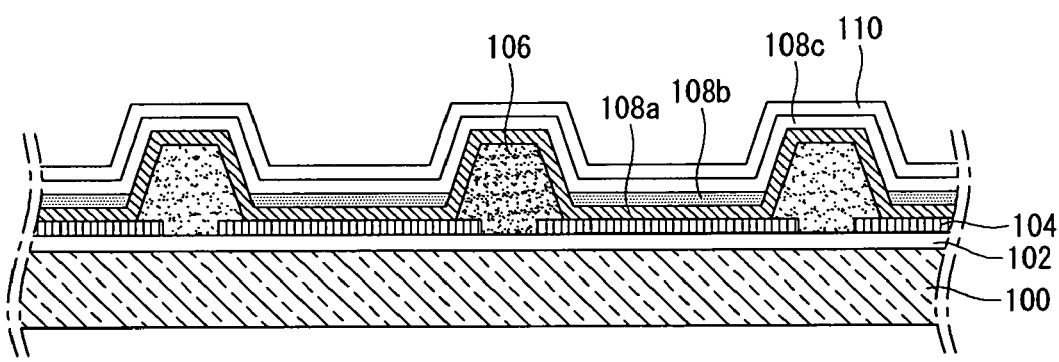

With reference to FIG. 7b, a second electrode 110 of OLED is formed on the entire surface of the acceptor substrate 100 with the electron relevant layer 108c formed thereon. The second electrode 110, a cathode electrode, may be formed with a single-layer structure made of a metal material or may be formed with a multi-layered structure including one or two metal layers interposed between dielectric layers. The second electrode 110 applies electrons, applied via the Vss supply wiring, to the organic compound layer.

As described above, according to the method of fabricating an OLED display device according to exemplary embodiments of the present invention, the doner substrate with the metal pattern and the organic emission layer material formed thereon is aligned and attached to the acceptor substrate with the TFT array under a vacuum or inert gas atmosphere, an instantaneous voltage/current is applied to the metal pattern of the doner substrate to generate Joule heat, and the organic emission layer material formed on the doner substrate is then sublimated by using the Joule heat, thus forming the light emission layer on the acceptor substrate.

Accordingly, compared with the existing boat method using a metal mask, in the present invention, the light emission layer can be precisely patterned to support the large area and high definition, a process TACT can be reduced in forming the light emission layer, and the size of the chamber for forming the light emission layer can be considerably reduced.

It will be apparent to those skilled in the art that various modifications and variation can be made in the present invention without departing from the spirit or scope of the invention. For example, in the exemplary embodiment of the present invention, the first and second electrodes are anode and cathode electrodes, respectively, but the present invention is not limited thereto and can be applicable as it is to the case where first and second electrodes are cathode and anode electrodes, respectively. In this case, the hole relevant layer as described in the exemplary embodiment of the present invention may be replaced by an electron relevant layer, and the electron relevant layer as described in the exemplary embodiment of the present invention may be replaced by a hole relevant layer. Thus, it is intended that the present invention cover the modifications and variations of this invention provided they come within the scope of the appended claims and their equivalents.

What is claimed is:

1. A method of fabricating an organic light emitting diode display device including a plurality of OLEDs each having a first electrode, a first layer, a light emission layer, a second layer, and a second electrode, the method comprising:
   sequentially forming a thin film transistor (TFT) array, the first electrode, a bank pattern, and a spacer on an acceptor substrate, and forming the first layer on the entire surface of the acceptor substrate with the bank pattern formed thereon;
   sequentially forming a metal pattern and an organic light emission material layer on a donor substrate;
   aligning and attaching the acceptor substrate and the donor substrate, and forming the light emission layer by transferring the organic light emission material layer onto the acceptor substrate by applying power to the metal pattern; and
   sequentially forming the second layer and the second electrode on the entire surface of the light emission layer-formed acceptor substrate,
   wherein the spacer is formed to be smaller than the bank pattern to reduce a contact area between the accepter substrate and the donor substrate in forming the light emission layer.

2. The method of claim 1, wherein the metal pattern is made of one or an ally of two or more of Ag, Au, Al, Cu, Mo, Pt, Ti, W, and Ta, and is patterned according to a pixel position of the acceptor substrate where the light emission layer is to be formed.

3. The method of claim 2, wherein the width of the metal pattern is smaller than or the same as the sum of a pixel width and a bank pattern width.

4. The method of claim 1, wherein the forming of the light emission layer is performed under a vacuum or an inert gas atmosphere.

5. The method of claim 1, wherein the power is applied one or several times with a power density of 0.1 W/cm2 ~10000 W/cm2 within one second.

6. The method of claim 1, wherein the spacer is formed as one of a line, column, and well type spacers.

7. The method of claim 1, further comprising:
   forming an electric insulation layer on the metal pattern before the organic light emission material layer is formed.

8. The method of claim 7, wherein the electric insulation layer comprises at least one of a silicon oxide film, a silicon nitride film, a silicon oxynitride film, and a spin-on-glass (SOG) material.

9. The method of claim 1, wherein the first and second electrodes are anode and cathode electrodes, respectively, the first layer is a hole layer handling introduction and carrying of holes, and the second layer is an electron layer handling introduction and carrying of electrons.

10. The method of claim 1, wherein the first and second electrodes are cathode and anode electrodes, respectively, the first layer is an electron layer handling introduction and carrying of electrons, and the second layer is a hole layer handling introduction and carrying of holes.

* * * * *